United States Patent
Xie et al.

(10) Patent No.: US 12,557,627 B2
(45) Date of Patent: Feb. 17, 2026

(54) STACKED FET WITH BOTTOM EPI SIZE CONTROL AND WRAPAROUND BACKSIDE CONTACT

(71) Applicant: International Business Machines Corporation, Armonk, NY (US)

(72) Inventors: Ruilong Xie, Niskayuna, NY (US); Jay William Strane, Wappingers Falls, NY (US); Shay Reboh, Guilderland, NY (US); Brent A. Anderson, Jericho, VT (US); Junli Wang, Slingerlands, NY (US); Albert M. Chu, Nashua, NH (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 370 days.

(21) Appl. No.: 18/451,952

(22) Filed: Aug. 18, 2023

(65) Prior Publication Data
US 2025/0062190 A1 Feb. 20, 2025

(51) Int. Cl.
| | |
|---|---|
| H01L 23/48 | (2006.01) |
| H10D 30/01 | (2025.01) |
| H10D 30/43 | (2025.01) |
| H10D 30/67 | (2025.01) |
| H10D 62/10 | (2025.01) |
| H10D 64/01 | (2025.01) |
| H10D 84/01 | (2025.01) |
| H10D 84/03 | (2025.01) |
| H10D 84/83 | (2025.01) |

(52) U.S. Cl.
CPC ......... *H01L 23/481* (2013.01); *H10D 30/014* (2025.01); *H10D 30/43* (2025.01); *H10D 30/6735* (2025.01); *H10D 30/6757* (2025.01); *H10D 62/121* (2025.01); *H10D 64/017* (2025.01); *H10D 84/0128* (2025.01); *H10D 84/0149* (2025.01); *H10D 84/0151* (2025.01); *H10D 84/038* (2025.01); *H10D 84/83* (2025.01)

(58) Field of Classification Search
CPC .................................................. H01L 23/481
USPC .......................................................... 257/734
See application file for complete search history.

(56) References Cited

U.S. PATENT DOCUMENTS

| | | | |
|---|---|---|---|
| 10,192,819 B1 | 1/2019 | Chanemougame et al. | |
| 10,192,867 B1 | 1/2019 | Frougier et al. | |
| 10,510,622 B1 | 12/2019 | Frougier et al. | |
| 11,322,590 B2 | 5/2022 | Jung et al. | |
| 2019/0311950 A1* | 10/2019 | Mehandru | H10D 30/6211 |
| 2020/0294998 A1* | 9/2020 | Lilak | H01L 23/535 |
| 2021/0351303 A1 | 11/2021 | Ju et al. | |
| 2021/0391421 A1 | 12/2021 | Chu et al. | |
| 2021/0399099 A1* | 12/2021 | Chu | H01L 21/28525 |
| 2022/0352032 A1 | 11/2022 | Lilak et al. | |

* cited by examiner

*Primary Examiner* — Ajay Arora
(74) *Attorney, Agent, or Firm* — Tutunjian & Bitetto, P.C; L. Jeffrey Kelly

(57) ABSTRACT

A semiconductor device includes a stacked transistor structure having field effect transistors on two levels. The two levels include a top side and a bottom side. Active regions are disposed on the bottom side including a leveled surface facing the top side and a faceted backside surface opposite the leveled surface. The leveled surface includes two different semiconductor materials. A backside contact in contact with the faceted backside surface forms a wraparound contact to reduce contact resistance.

20 Claims, 18 Drawing Sheets

STACKED FET WITH BOTTOM EPI SIZE CONTROL AND WRAPAROUND BACKSIDE CONTACT

BACKGROUND

The present invention generally relates to semiconductor devices and processing methods, and more particularly to stacked field effect transistors (FETs) with a backside epitaxial grown region which accounts for process size variations and has a wraparound backside contact in contact therewith.

Stacked transistor devices may be used to increase areal density of devices on a chip. Additionally, the close proximity of the overlying and underlying devices can be useful when forming paired devices, such as complementary semiconductor devices that include two devices of opposing polarity. However, positioning transistors above one another places spatial and electrical constraints that can make it challenging to provide required performance.

Stacked field effect transistors (FETs) formed by epitaxial growth processes suffer from height and size differences that are difficult to precisely control. In addition, controlling backside contact resistance (Rc) is challenging due to backside thermal budget limitations and insufficient space to permit adequate electrical contact.

SUMMARY

In accordance with an embodiment of the present invention, a semiconductor device includes a stacked transistor structure having field effect transistors on at least two levels, the at least two levels including a top side and bottom side. Active regions are disposed on the bottom side including a leveled surface facing the top side and a faceted backside surface opposite the leveled surface. The leveled surface includes two different semiconductor materials. A backside contact in contact with the faceted backside surface forms a wraparound contact to reduce contact resistance.

In accordance with another embodiment of the present invention, a method for fabrication of a semiconductor device includes forming bottom active regions with a first semiconductor material through a shallow trench isolation region on a substrate, the bottom active regions including faceted surfaces; filling regions between the bottom active regions with a second semiconductor material; recessing the second semiconductor material and the first semiconductor material to provide a level surface across the bottom active regions; and laterally cutting the bottom active regions to provide a substantially uniform lateral dimension for each of the bottom active regions. A bottom interlevel dielectric layer (ILD) is formed, and top structures including top active regions, gate structures and top metallization structures are fabricated. The substrate is removed from a bottom side and the second semiconductor material is exposed on the bottom side of at least one of the bottom active regions. The second semiconductor material is selectively removed to expose the faceted surfaces of the at least one of the bottom active regions, and a backside wraparound contact in contact with exposed surfaces including the faceted surfaces of the at least one of the bottom active regions is formed.

In accordance with another embodiment of the present invention, a method for fabrication of a semiconductor device includes forming sacrificial placeholders through a shallow trench isolation (STI) region formed on a substrate; epitaxially growing bottom active regions with a first semiconductor material from the sacrificial placeholders, the bottom active regions including top faceted surfaces and bottom faceted surfaces; filling regions between the bottom active regions with a second semiconductor material; recessing the second semiconductor material and the first semiconductor material to provide a level surface across the bottom active regions; forming an organic planarizing layer (OPL) over the level surface; etching through the OPL and portions of the bottom active regions to cut the substantially uniform lateral dimension into the bottom active regions; forming a bottom interlevel dielectric layer (ILD); fabricating top structures including top active regions, gate structures and top metallization structures; applying a carrier wafer over the top structures; flipping the semiconductor device; removing the substrate from a bottom side; exposing the second semiconductor material on the bottom side of at least one of the bottom active regions including removing exposed sacrificial placeholders and opening up the STI region; selectively removing the second semiconductor material to expose the faceted surfaces of the at least one of the bottom active regions; and forming a backside wraparound contact in contact with exposed surfaces including the bottom faceted surfaces of the at least one of the bottom active regions.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

In accordance with embodiments of the present invention, devices and methods are described which include controlling a size and shape of bottom epitaxial formed regions (epi regions) in a stacked field effect transistor (FET) device. In addition, a wraparound contact is formed in contact with the epi regions. The wraparound contact contacts multiple facets of the epi regions to provide a greater surface area of contact and reduce surface contact resistance (Rc).

In useful embodiments, a semiconductor wafer includes a semiconductor substrate. A semiconductor device is provided by growing an active region, e.g., a bottom source/drain (S/D) epitaxial grown (epi) region with a first semiconductor material from the substrate. Since the S/D epi regions are grown from the semiconductor material of the substrate, the S/D epi regions grow with a faceted shape. A second semiconductor material is formed over (e.g., overfill portions) the faceted shape of the S/D epi regions. The semiconductor overfill is then recessed by etching around the S/D epi regions. The recessing provides a flat and even surface across multiple S/D epi regions. The flat surface also process a good target for landing top down contacts. A lateral cut process can be employed to define and control lateral dimensions of the S/D epi regions with overfill portions. An interlevel dielectric layer is deposited and recessed to cover the S/D epi regions with the overfill portions.

Processing continues by forming top side structures including top epi regions, replacement metal gates (RMGs), middle of the line (MOL) contacts, back end of the line (BEOL) structures and layers. A bonding carrier wafer can be adhered to the top side surface of the wafer. The wafer can be flipped to work on a bottom side of the device. The substrate can then be removed. A backside contact opening is formed that exposes the second semiconductor material under the faceted bottom of the S/D epi regions. The second semiconductor material is then selectively removed to expose the facets of the S/D epi regions. A backside wraparound contact is then deposited which contacts the exposed facets of the S/D epi regions.

The bottom S/D epi regions are trimmed to have their size and shape carefully and precisely controlled by one or more of the processes employed in accordance with the present invention. For example, a height of the S/D epi regions is accurately controlled by a recess etch of the second semiconductor material from the top side. In addition, a lateral cut etch controls the lateral size of the S/D epi regions. The size and shape of the bottom S/D epi regions is therefore reliably controlled despite variations of the S/D epi regions during their formation. Further, the faceted surface of the S/D epi regions permits increased surface area for bottom contacts, which in turn, reduces contact resistance Rc.

Figure 1:
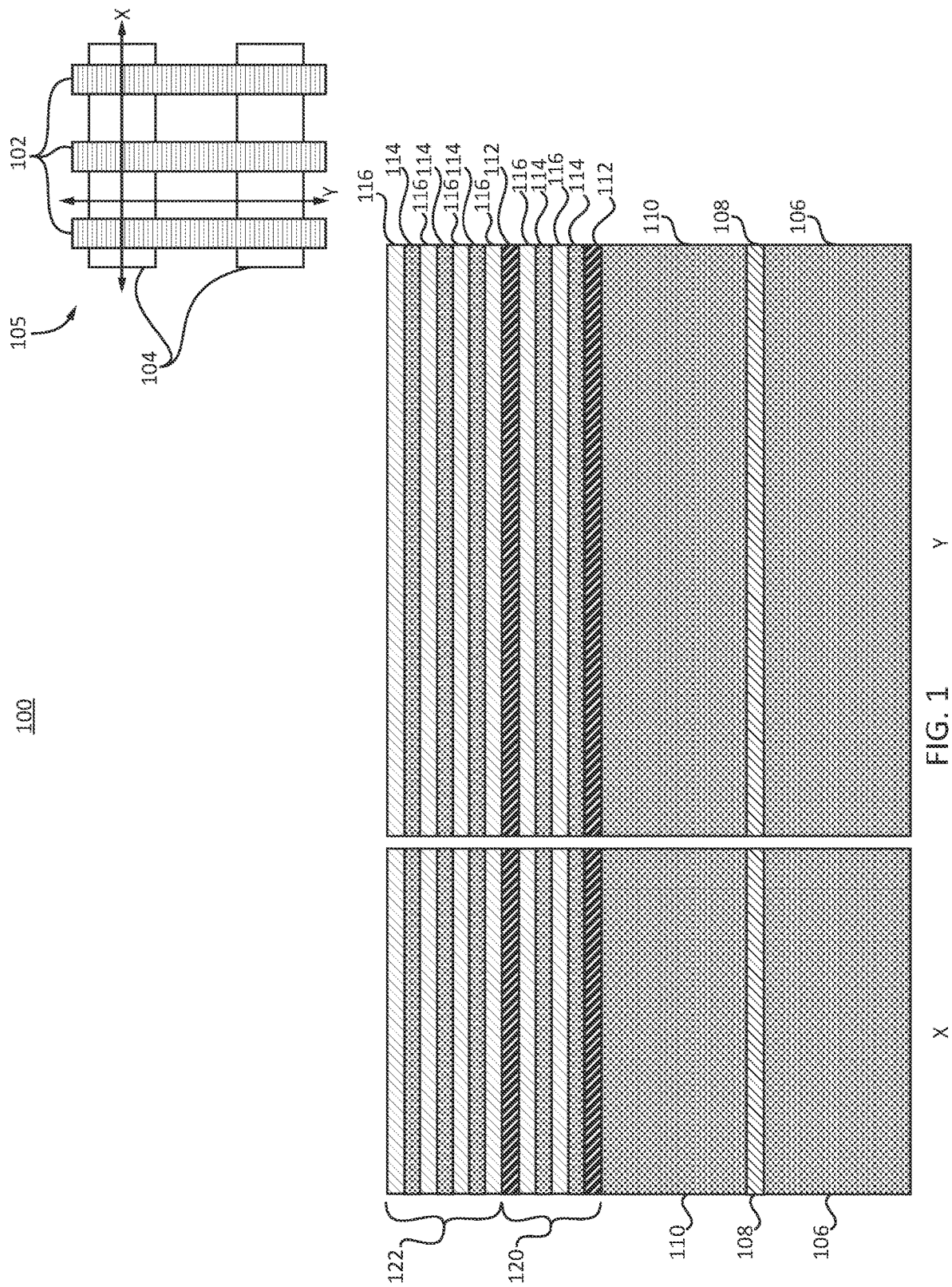
FIG. 1 shows cross-sectional views, taken at section lines X and Y as shown in an inset (and referred to as section X and section Y respectively), of a semiconductor substrate and a stack of layers that can be formed or provided in one or more nanosheets, in accordance with an embodiment of the present invention.

Referring now to the drawings in which like numerals represent the same or similar elements and initially to FIG. 1, devices and methods for manufacturing a stacked field effect transistor (FET) device are shown in accordance with embodiments of the present invention. A wafer 100 includes a substrate 106 having multiple layers on which the stacked FET device will be fabricated. FIG. 1 depicts two orthogonal views X and Y taken at corresponding sections X and Y in inset 105. Inset 105 shows gate lines 102 and active regions lines 104 for reference. Corresponding X and Y views are depicted throughout FIGS. 1-18. Active region lines 104 represent S/D regions for transistor devices to be formed, and gate lines 102 are represented for such transistor devices. Transistor channels are formed on the active region lines 104 below the gate lines 102.

The substrate 106 can include any suitable substrate structure, e.g., a bulk semiconductor, a semiconductor-on-insulator (SOI) substrate, etc., and preferably includes a monocrystalline semiconductor. In one example, the substrate 106 can include a silicon-containing material. Illustrative examples of Si-containing materials suitable for the substrate 106 can include, but are not limited to, Si, SiGe, SiGeC, SiC and multi-layers thereof. Although silicon is the predominantly used semiconductor material in wafer fabrication, alternative semiconductor materials can be employed as additional layers, such as, but not limited to, germanium, gallium arsenide, gallium nitride, silicon germanium, cadmium telluride, zinc selenide, etc.

An etch stop layer 108 is formed on the substrate 106. The etch stop layer 108 can include an epitaxially grown crystal structure. The etch stop layer 108 includes a material that permits the selective etching and removal the substrate 106 in later steps. In one embodiment, the etch stop layer 108 includes SiGe although depending on the material of the substrate 106, other materials can be selected, e.g., SiGeC, SiC, etc.

A semiconductor layer 110 is epitaxially grown on the etch stop layer 108. The semiconductor layer 110 can include a same material as the substrate 106, although other semiconductor materials can be employed, e.g., SiGe, SiGeC, SiC, etc.

A layer stack or stacks are applied to or formed on the semiconductor layer 110. In one embodiment, one or more nanosheets (NS) are applied to the semiconductor layer 110. In another embodiment, the layer stacks can be epitaxially grown using different chemistries to form layers having different properties. In an embodiment, a layer stack 120 includes a semiconductor layer 112 followed by a semiconductor layer 114, a semiconductor layer 116, a semiconductor layer 114, a semiconductor layer 116 and a semiconductor layer 114. A layer stack 122 includes a semiconductor layer 112 followed by a semiconductor layer 114, a semiconductor layer 116, a semiconductor layer 114, a semiconductor layer 116, a semiconductor layer 114 and a semiconductor layer 116.

Each of semiconductor layers 112, 114 and 116 are selectively removeable relative to the others, e.g., by a selective etching process. In one embodiment, semiconductor layer 112 includes SiGe, where Ge is 55 atomic % of the compound; semiconductor layer 114 includes SiGe, where Ge is 30 atomic % of the compound, and semiconductor layer 116 includes Si. It should be understood that other materials or atomic percentages can be employed for semiconductor layers 112, 114 and 116. In other embodiments, different stack orders and numbers may be employed for semiconductor layers 112, 114 and 116.

Figure 2:
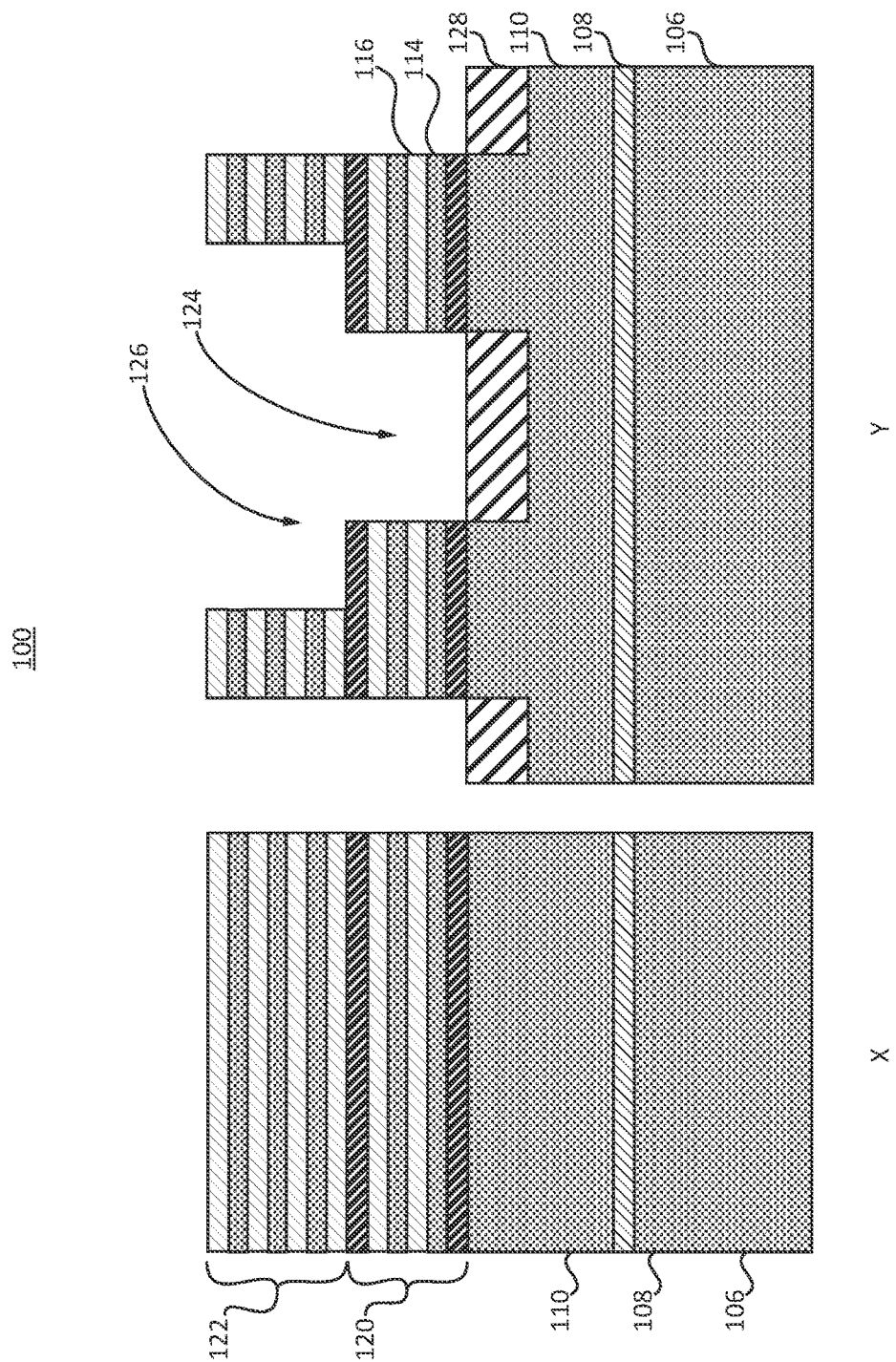
FIG. 2 shows cross-sectional views, taken at section lines X and Y, of the stack of layers patterned and a shallow trench isolation region formed, in accordance with an embodiment of the present invention.

Referring to FIG. 2, a single or multiple nanosheets or an epitaxial grown layer stack can include the stacks 120 and 122 which can be patterned to expose and etch the semiconductor layer 110. In one embodiment, a hard mask (not shown) may be formed by blanket depositing a layer of hard mask material, providing a patterned photoresist on top of the layer of hard mask material, and then etching the layer of hard mask material to provide the hard mask pattern for etching the stacks 120 and 122. The patterned photoresist can be produced by applying a blanket photoresist layer to the surface of the hard mask material and exposing the photoresist layer to a pattern of radiation, and then developing the pattern into the photoresist layer utilizing resist developer. The pattern in the photoresist layer is transferred to the hard mask by an etch process.

Opening 126 is formed through stack 122, and opening 124 is formed through stack 120. Openings 126 and 124 can be formed using an anisotropic etch process, such as a reactive ion etch (RIE) or an ion beam etch (IBE). Semiconductor layer 110 is further etched to form shallow trenches therein in accordance with opening 124. Shallow trench isolation (STI) or STI region 128 is formed in the etched trenches. STI 128 can be formed by depositing dielectric material, such as, e.g., $SiO_2$, $SSiO_xN_y$, SiCO or other suitable compounds. STI 128 can be deposited using chemical vapor deposition (CVD), although other deposition methods can be employed. The STI 128 can then be etched, e.g., by RIE, to a level of the semiconductor layer 110.

Figure 3:
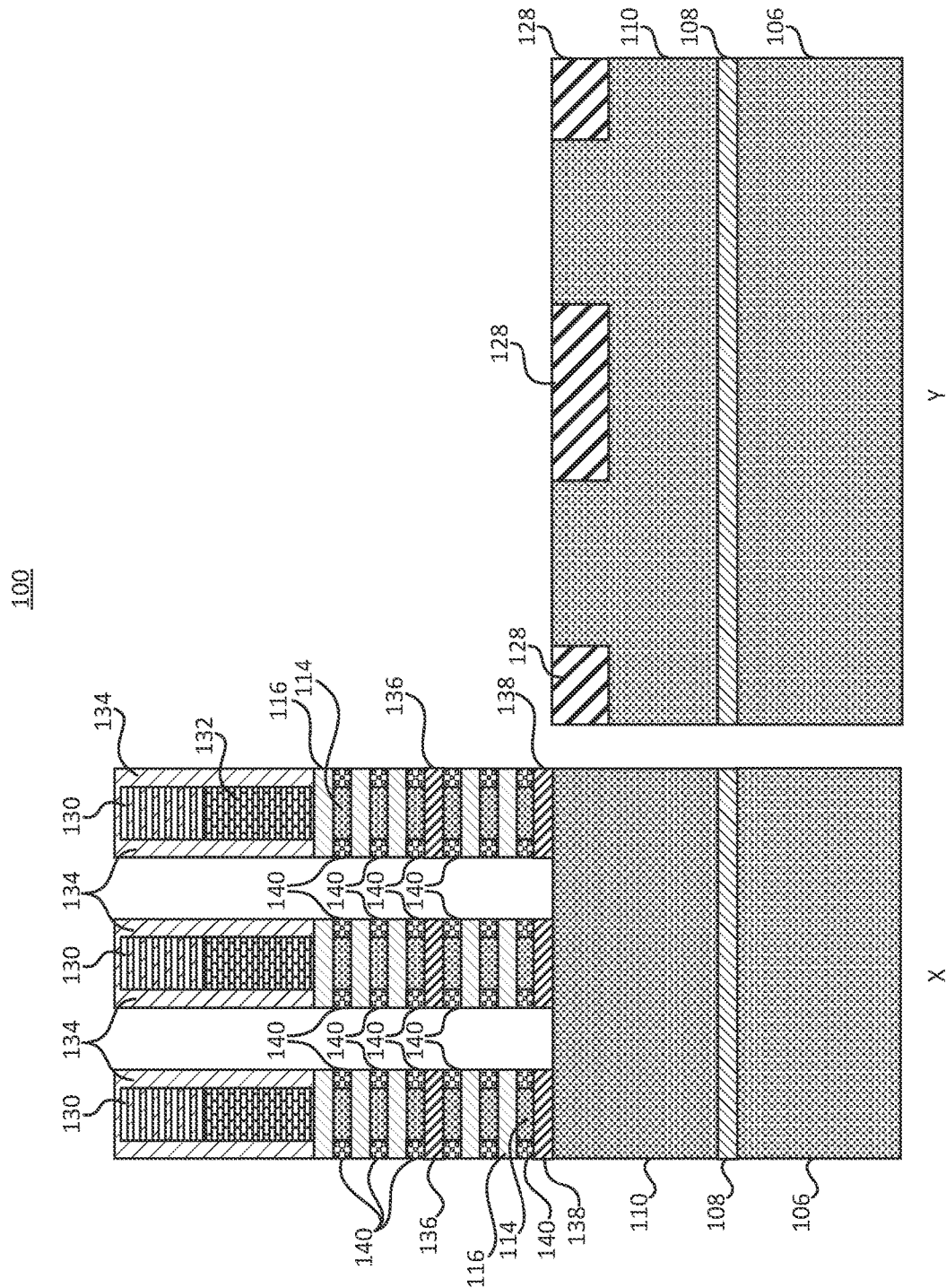
FIG. 3 shows cross-sectional views, taken at section lines X and Y, of the stack of layers removed in section Y and dummy gate structures formed in section X, in accordance with an embodiment of the present invention.

Referring to FIG. 3, a dummy gate material for dummy gates 132 is blanketed over the wafer 100 followed by a blanket deposition of a hard mask material to later form patterned hard mask 130, e.g., by using photolithographic patterning. The dummy gate material can include a polysilicon, amorphous Si or other selectively removeable material. Semiconductor layer 112 is removed by a selective etch process by accessing the semiconductor layer 112 longitudinally in the direction of the dummy gates 132. The hard mask material is patterned to form hard mask 130. The hard mask 130 is employed to etch the dummy gates 132. Then, a deposition process is employed to form spacers 134, middle dielectric interface (MDI) 136 and bottom dielectric interface (BDI) 138 to fill empty regions where semiconductor layer 112 was removed. Spacers 134, MDI 136 and BDI 138 can include an oxide, such as silicon dioxide, although other dielectric materials can be employed.

The hard mask 130 and spacers 134 can be employed as an etch mask to recess the nanosheet (e.g., stacks 120 and 122) to expose semiconductor layer 110. Regions of the nanosheet below the hard mask 130 and spacers 134 are patterned for further processing while the nanosheet (e.g., stacks 120 and 122) is completely removed in other regions.

Inner spacers 140 are formed and include a dielectric material. In one embodiment, the inner spacers 140 are formed using exposed portions of the semiconductor layer 114, which undergo a Ge condensation process to form a dielectric oxide ($SiO_2$) at the exposed portions by a thermal oxidation process. The oxidation process converts SiGe to the dielectric material and condenses out Ge.

Figure 4:
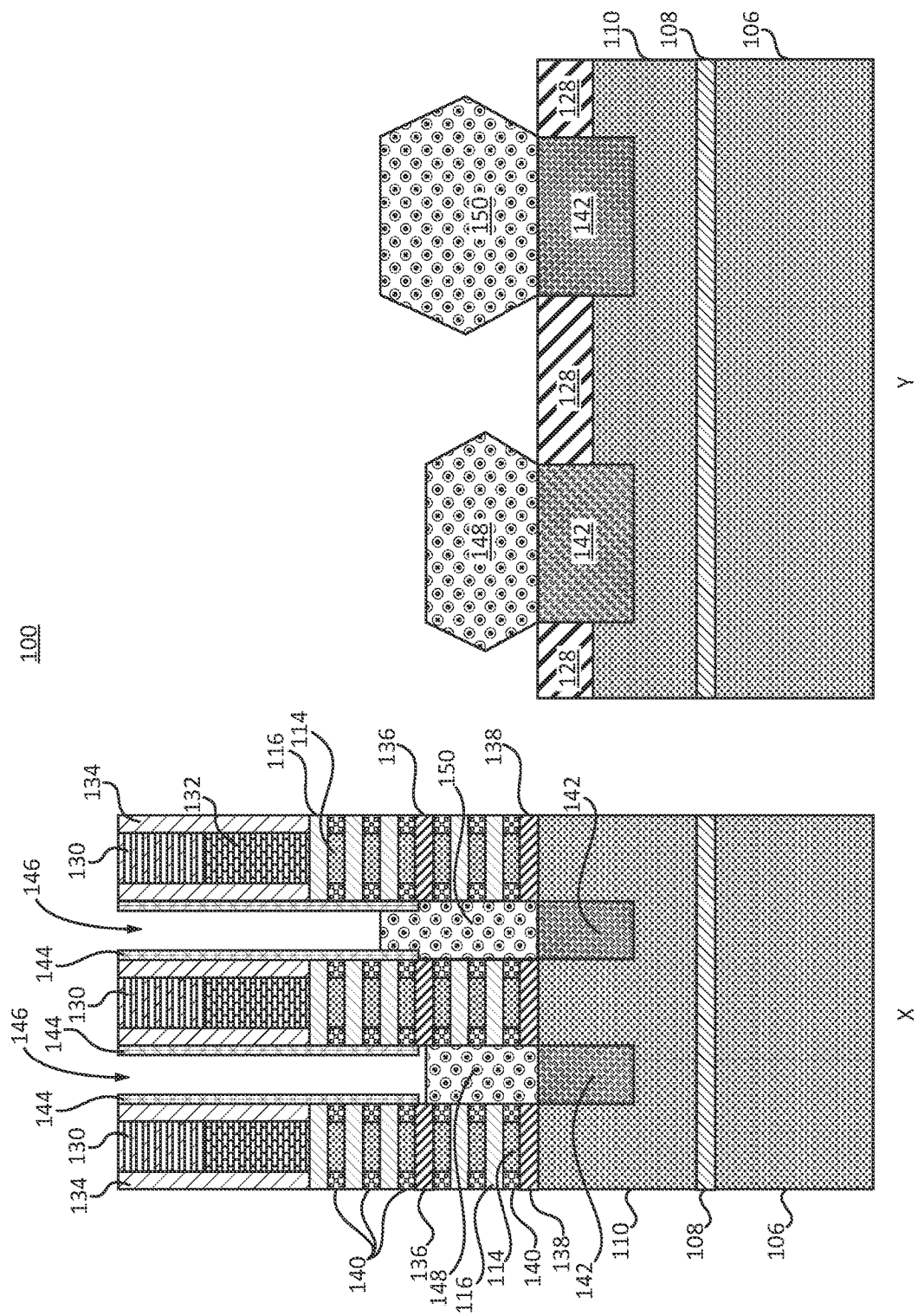
FIG. 4 shows cross-sectional views, taken at section lines X and Y, after formation of upper channel liners and bottom active regions formed on sacrificial placeholders, in accordance with an embodiment of the present invention.

Referring to FIG. 4, the hard mask 130 and spacers 134 can be employed as an etch mask to recess the semiconductor layer 110. The semiconductor layer 110 is recessed to form trenches, e.g., by RIE. Within the trenches recessed into the semiconductor layer 110, a sacrificial placeholder 142 is formed. The sacrificial placeholder 142 can be epitaxially grown in the trenches of semiconductor layer 110. The sacrificial placeholder 142 can include SiGe or other epitaxial grown material that can be selectively removed relative to the semiconductor layer 110.

A protective liner 144 is formed along sidewalls down to MDI 136. Channels 146 can be filled with a sacrificial material (not shown) up to MDI 136 followed by a conformal deposition of material for the protective liner 144 (e.g., SiN). The protective liner 144 can be removed from horizontal surfaces by a selective etch, e.g., RIE, to remain in an upper region of channels 146.

An epitaxial growth process is performed to form bottom active regions 148 and 150. Bottom active regions 148 and 150 are employed to form source and drain (S/D) regions for bottom transistors of the stacked FET device under construction. Bottom active regions 148 and 150 can include Si or SiGe and include faceted surfaces when epitaxial growth is not confined. In one embodiment, the bottom active regions 148 and 150 can be designated as P-type or N-type devices. The P-type and N-type devices can have material selected for the bottom active regions 148 and 150. For example, if the bottom active regions 148 and 150 include N-type devices than the bottom active regions 148 and 150 can include Si. In another example, if the bottom active regions 148 and 150 include P-type devices than the bottom active regions 148 and 150 can include SiGe. The bottom active regions 148 and 150 can be appropriately doped during the formation of the bottom active regions 148 and 150 by epitaxial growth. For example, the bottom active regions 148 and 150 can be doped by introducing p dopants (e.g., B, Ga, etc.) during epitaxial formation. Similarly, the bottom active regions 148 and 150 can be doped by introducing n dopants (e.g., P, As, etc.) during epitaxial formation. In other embodiments, P-type and N-type devices can be formed adjacent to one another. Processing would include forming one device type and then the other device type by employing block masks to protect each device during processing of the other. In such an instance, fill materials will also be appropriately applied depending on the device type (e.g., amorphous semiconductor fill 152).

Bottom active region 148 and bottom active region 150 show size variations due to the formation process. As illustratively shown in FIG. 4, bottom active region 148 is smaller in height and width than bottom active region 150 in this example.

Figure 5:
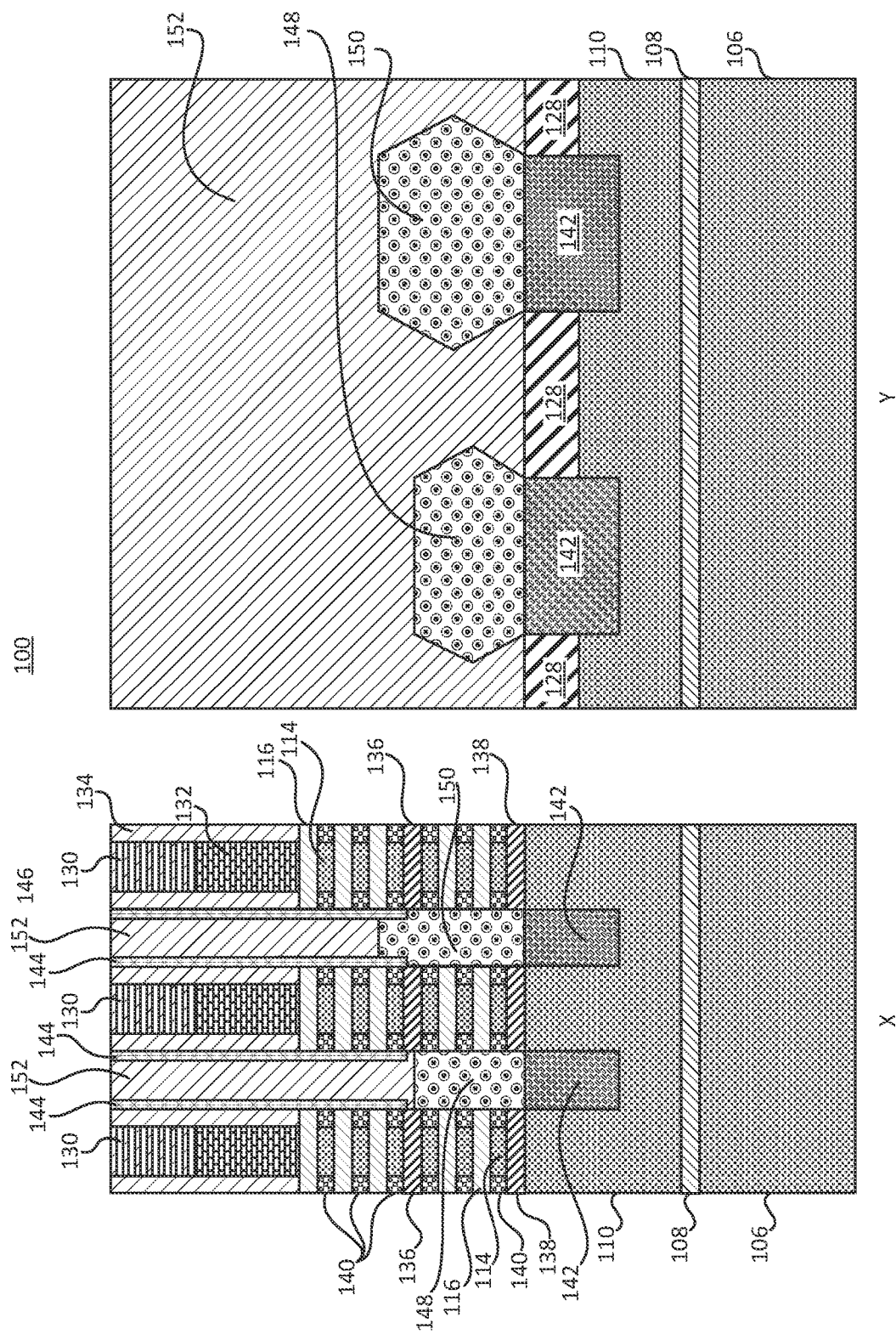
FIG. 5 shows cross-sectional views, taken at section lines X and Y, after overfilling a semiconductor material over the bottom active regions, the semiconductor material including, e.g., an amorphous phase, and having a material type selected in accordance with a material of the bottom active regions, in accordance with an embodiment of the present invention.

Referring to FIG. 5, a semiconductor fill 152 is provided over the bottom active regions 148 and 150. The semiconductor fill 152 can include an undoped semiconductor material. The semiconductor fill 152 can include an amorphous phase semiconductor material. The semiconductor fill 152 can include a material that is dependent upon the type of dopants employed in the bottom active regions 148 and 150. In an embodiment, the semiconductor fill 152 can include, e.g., amorphous Si if the bottom active regions 148 and 150 include P-type devices. In an embodiment, the semiconductor fill 152 can include, e.g., amorphous SiGe if the bottom active regions 148 and 150 include N-type devices. This material selection also provides etch selectivity which will be employed in later steps.

After formation of the semiconductor fill 152, a planarization process can be performed to planarize a top surface of the wafer 100. In one embodiment, the planarization process can include a chemical mechanical polish (CMP).

Figure 6:
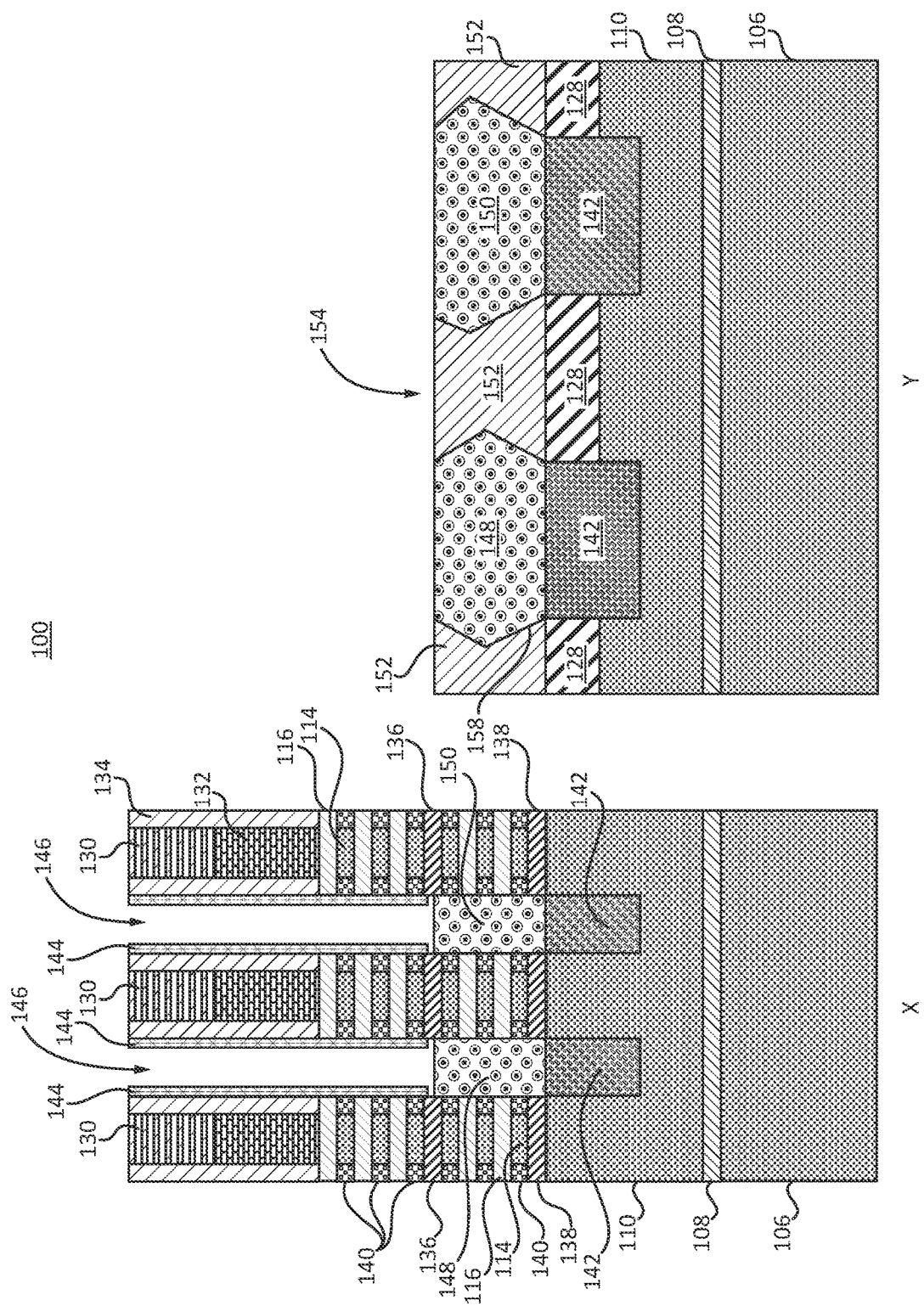
FIG. 6 shows cross-sectional views, taken at section lines X and Y, after a recess or etch back of the semiconductor material over the bottom active regions, the semiconductor material and the bottom active regions being leveled to a surface to control a height of the bottom active regions, in accordance with an embodiment of the present invention.

Referring to FIG. 6, an accurately controlled anisotropic etch is employed to recess the amorphous semiconductor fill 152 and to level the bottom active regions 148 and 150. In one embodiment, a reactive ion etch (RIE) process is employed to selectively remove the semiconductor fill 152 from the channels 146 stopping at about a level of the MDI 136 and to level a surface 154 across both the semiconductor fill 152 and the bottom active regions 148 and 150. In one embodiment, a timed etch is employed. The surface 154 at the bottom active regions 148 and 150 provides a good landing area for top down contacts in later steps.

Figure 7:
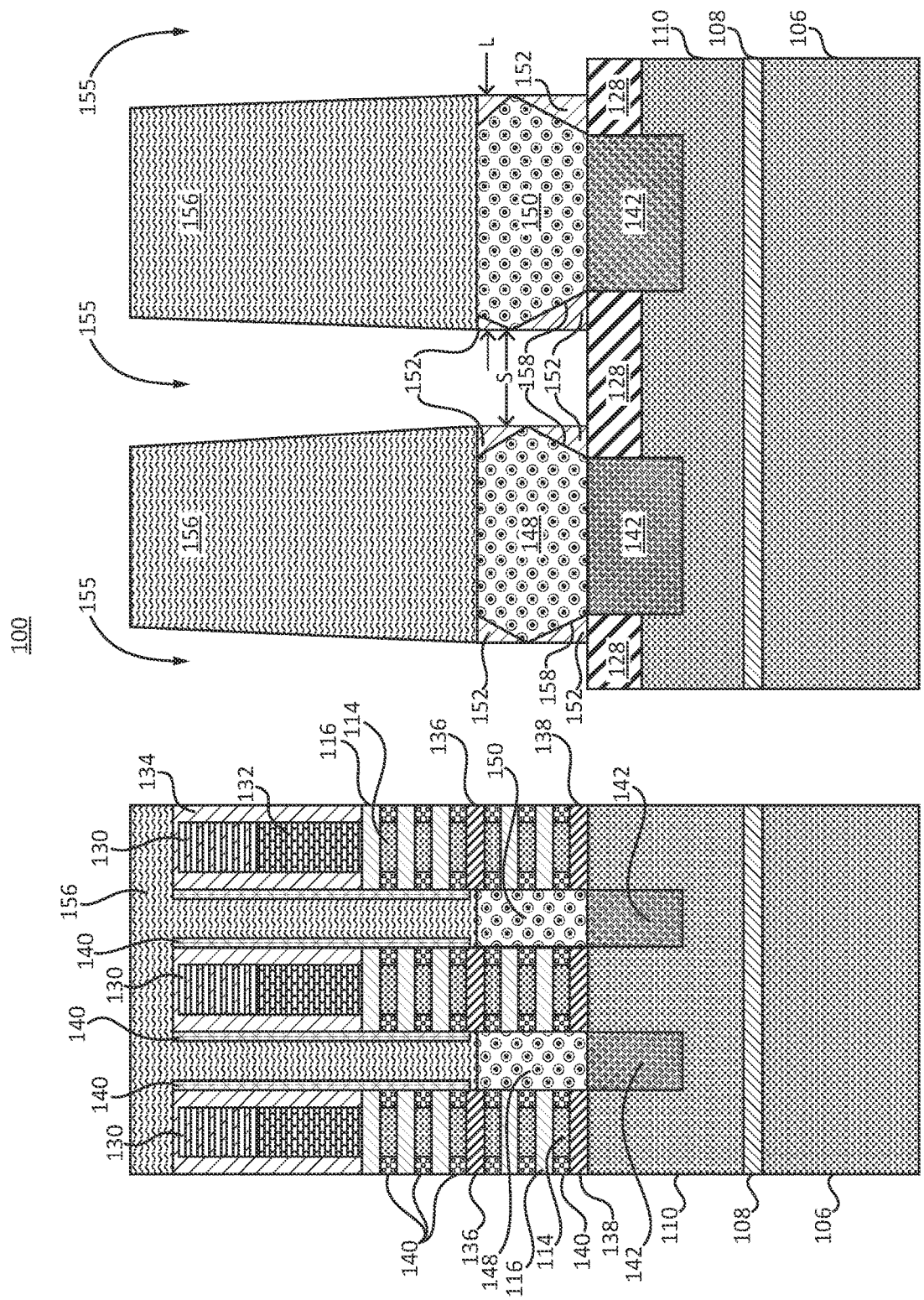
FIG. 7 shows cross-sectional views, taken at section lines X and Y, after an organic planarization layer is formed over the leveled surface, the semiconductor material and the bottom active regions being etched to cut lateral portions to achieve substantially uniform lateral dimensions of the bottom active regions, in accordance with an embodiment of the present invention.

Referring to FIG. 7, a patternable material is deposited or spun onto a surface of the wafer 100. The patternable material is employed for a bottom epitaxial material cut to account for size variations in the bottom active regions 148 and 150. In one embodiment, an organic planarization layer (OPL) 156 is formed over the wafer 100. In some embodiments, an anti-reflective coating (ARC) layer (not shown) may be formed on the OPL 156 followed by a layer of photoresist formed on the ARC layer. The layer of photoresist can be imaged with an image pattern and developed to form an etch mask. The OPL 156 can be etched in accordance with the etch mask to open up trenches 155 in the OPL 156 along bottom active regions 148 and 150. The trenches 155 are accurately controlled by an anisotropic etch, e.g., a RIE etch or IBE etch. The anisotropic etch, such as a plasma dry etch, is accurately controlled since a lithographic process is employed. A frontside lithographic process, e.g., can have overlay error of three standard deviations <5 nm. Hence, this error is much smaller than epitaxial lateral size variations.

Etching of the OPL 156 in accordance with the etch mask may include an etch chemistry for removing the OPL 156, semiconductor fill 152 and bottom active regions 148 and 150 at a substantially same (e.g., within 10%) etch rate to accurately control a lateral dimension S between the bottom active regions 148 and 150 and thereby controlling a lateral dimension L of the bottom active regions 148 and 150. The top down etch preserves faceted surfaces 158 at the underside of bottom active regions 148 and 150. These faceted surfaces 158 will be employed in later steps to provide a wraparound contact.

Figure 8:
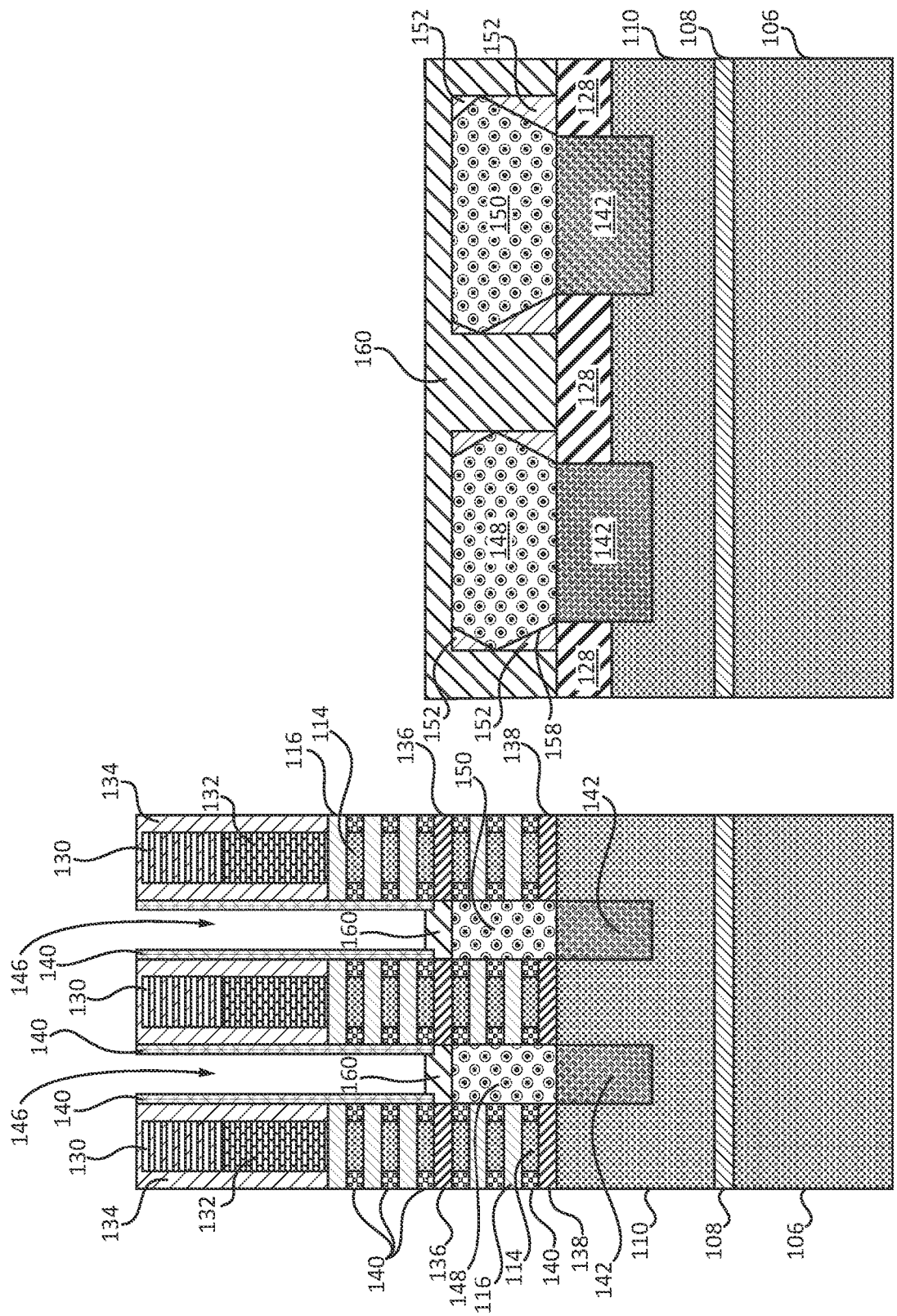
FIG. 8 shows cross-sectional views, taken at section lines X and Y, after the organic planarization layer is removed, a bottom interlevel dielectric layer is formed and recessed or etched back, in accordance with an embodiment of the present invention.

Referring to FIG. 8, the OPL 156 is stripped or removed from the wafer 100. A dielectric layer 160, such as, e.g., an interlevel dielectric layer (ILD) is formed on the wafer 100. The dielectric layer 160 can include any suitable material, e.g., selected from the group consisting of silicon containing materials such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, $\alpha$-C:H). The dielectric layer 160 can be deposited using CVD, although other deposition methods can be employed.

The dielectric layer 160 is then recessed by an etch back process that removes the dielectric layer 160 evenly (level) across the wafer 100. The recessed dielectric layer 160 forms a bottom ILD layer.

Figure 9:
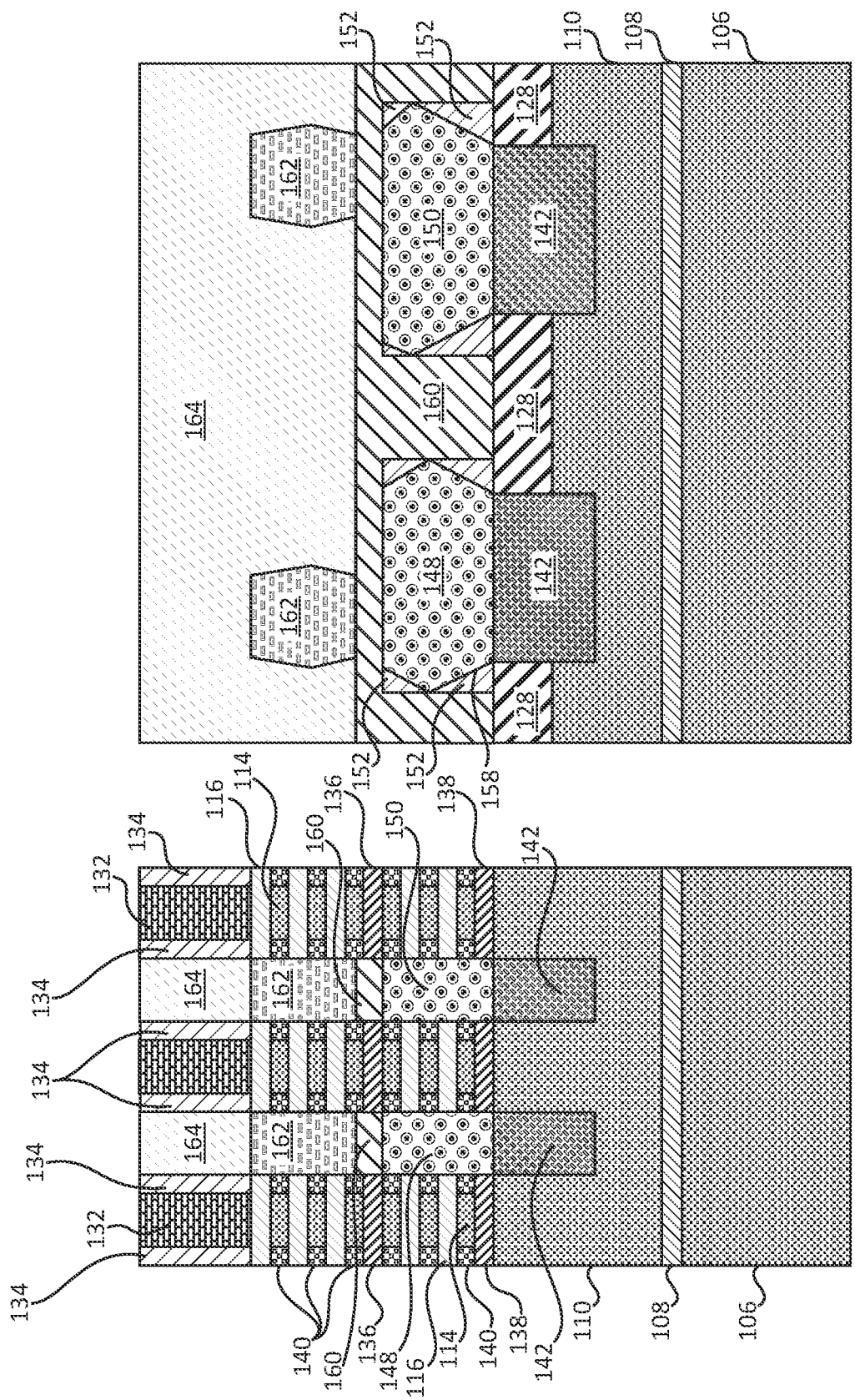
FIG. 9 shows cross-sectional views, taken at section lines X and Y, after top active regions are formed and a top interlevel dielectric layer is formed, in accordance with an embodiment of the present invention.

Referring to FIG. 9, the protective liner 144 is removed from upper sidewalls of channels 146 (FIG. 8). The protective liner 144 can be removed using a selective dry etch.

An epitaxial growth process is employed to grow top active regions 162. Top active regions 162 will form S/D regions for top FETs for the stacked FET device under fabrication. The top active regions 162 can utilize the semiconductor layers 116 to initiate crystal growth. The top active regions 162 are separated from the bottom active regions 148 and 150 by the dielectric layer 160 (bottom ILD).

A dielectric layer 164 is deposited over the wafer 100. The same process used for the formation of dielectric layer 160 can be employed for dielectric layer 164, although dielectric layer 164 may include a different composition to enable etch selectivity. For example, if dielectric layer 160 includes a silicon oxide, dielectric layer 164 can include a silicon nitride to be selectively etchable with respect to dielectric layer 160. The dielectric layer 164 is planarized, e.g., by CMP, which also removes the hard mask 130 and portions of the spacers 134.

Figure 10:
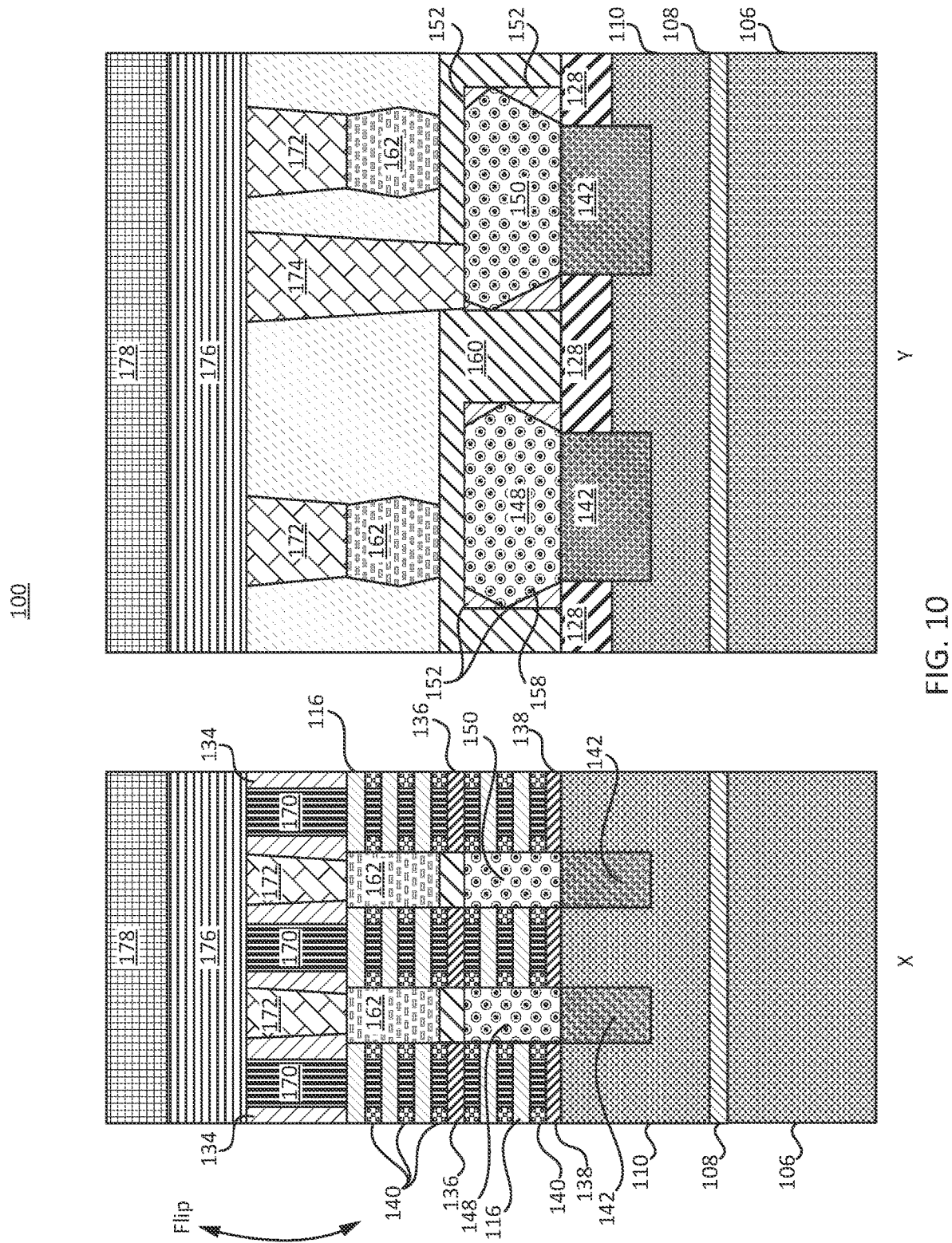
FIG. 10 shows cross-sectional views, taken at section lines X and Y, after the top interlevel dielectric layer is patterned, middle of the line contacts formed, back end of the line structures are formed, a carrier wafer is applied and structure is flipped to process the bottom side, in accordance with an embodiment of the present invention.

Referring to FIG. 10, dummy gates 132 and semiconductor layers 114 are removed by etching. This can include separate etch processes. The regions of the dummy gates 132 and the semiconductor layers 114 have a high dielectric constant (high-K) gate dielectric formed followed by a gate metal fill. This process is known as a High-K Metal Gate (HKMG) process to form a gate structure for selectively activating top FETs and bottom FETs. The gate structures are separated by MDI 136 and the FETs are separated by the dielectric layer 160.

Middle of the line (MOL) contacts are formed to make connections with the top active regions 162 and the bottom active regions 148 and 150 from a top side of the device. Trenches or holes are formed in the dielectric layer 164, which forms a top ILD. The trenches or holes expose the underlying active materials for the active regions 162, 148 and 150 and can expose portions of the semiconductor fill 152. The leveled top surface across active regions 148 and 150 can include portions of semiconductor fill 152 to provide expanded landing area for top-down contacts. The leveled top surface is formed from two different semiconductor materials, the doped active region material (for regions 148 and 150) and the semiconductor fill 152. The semiconductor fill 152 expands the landing area for contacts and can permit the contacts more target area within the design to avoid nearby structures, e.g., nearby conductors, or to provide more geometric tolerances.

In useful embodiments, a silicide liner, such as Ti, Ni, NiPt is deposited first, then a diffusion barrier can be formed in the trenches prior to a conductive fill. The diffusion barrier can include, e.g., TiN, TaN, or similar materials.

A conductive fill is performed to fill the trenches on top of the diffusion barrier, if present. The conductive fill can include materials, such as, e.g., Cu, Ru, Mo, Rh, W, Ir, and alloys or combinations of these and other conductive materials. In a particularly useful embodiment, the conductive fill includes Cu. The conductive fill can be formed using a deposition method, such as, e.g., CVD, plasma enhanced CVD (PECVD), atomic layer deposition (ALD) or any other suitable deposition method. The conductive fill is planarized, e.g., by CMP, to form contacts 172, 174.

Processing continues with the formation of back end of the line (BEOL) layer 176, which can include metal structures and dielectric layers to complete the top side of the stacked FET device and provide electrical access to the devices formed. A carrier wafer 178 can be bonded to the BEOL layer 176. The carrier wafer 178 provides support and transportability to the wafer 100 for further processing which includes flipping the wafer 100 and removing portions of a bottom side of the stacked FET device.

Figure 11:
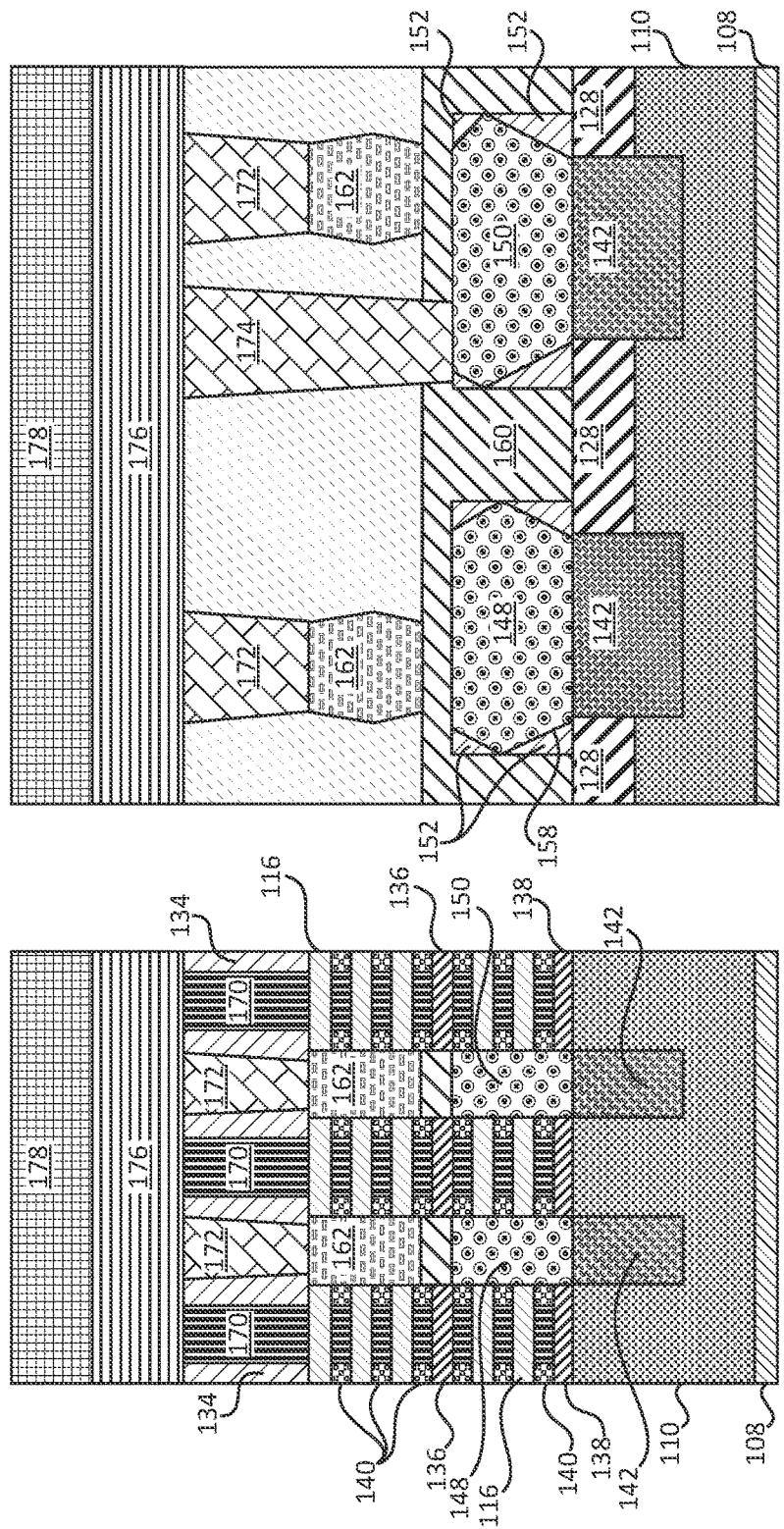
FIG. 11 shows cross-sectional views, taken at section lines X and Y, after the substrate has been removed to an etch stop layer, in accordance with an embodiment of the present invention.

Referring to FIG. 11, to continue processing, the wafer 100 can be flipped to process features on the bottom side of the stacked FET device. However, for clarity and consistency, the stacked FET device will be shown in the FIGS. in a same orientation as previously described with continued and consistent reference to bottom/top. The substrate 106 is removed from the bottom side of the stacked FET device. The substrate 106 can be removed by an etch process that stops on the etch stop layer 108. In an alternate embodiment, a cleave process can be employed to propagate a crack to remove the substrate 106 at the etch stop layer 108.

Figure 12:
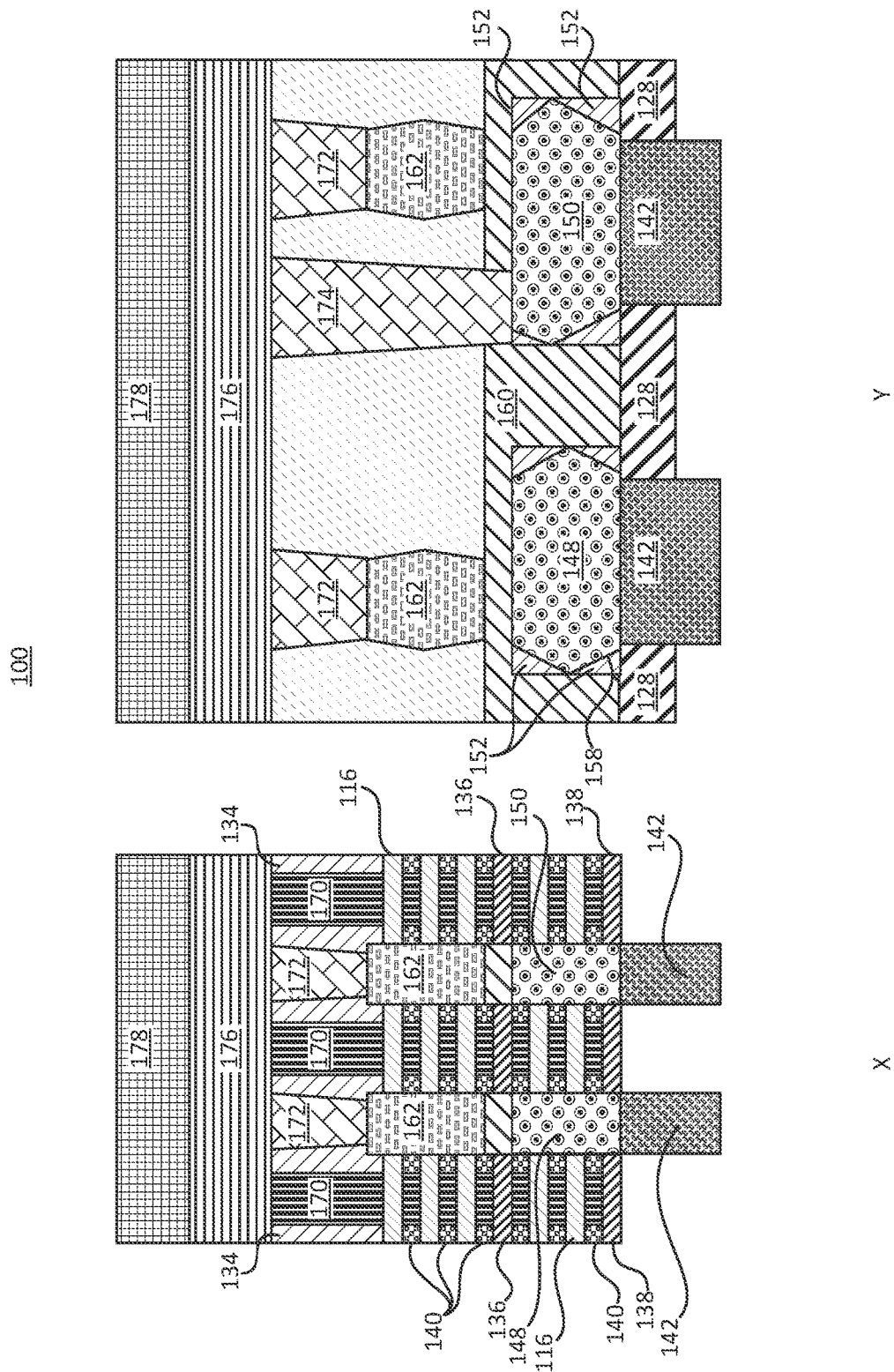
FIG. 12 shows cross-sectional views, taken at section lines X and Y, after the sacrificial placeholders have been exposed by etching, in accordance with an embodiment of the present invention.

Referring to FIG. 12, the etch stop layer 108 is then removed by an etch process. In an alternate embodiment, a CMP process can be employed. With the removal of the etch stop layer 108, the semiconductor layer 110 is exposed. The semiconductor layer 110 is removed by an etch process that selectively removes the material of the semiconductor layer 110 relative to the STI 128, the sacrificial placeholders 142 and BDI 138.

Figure 13:
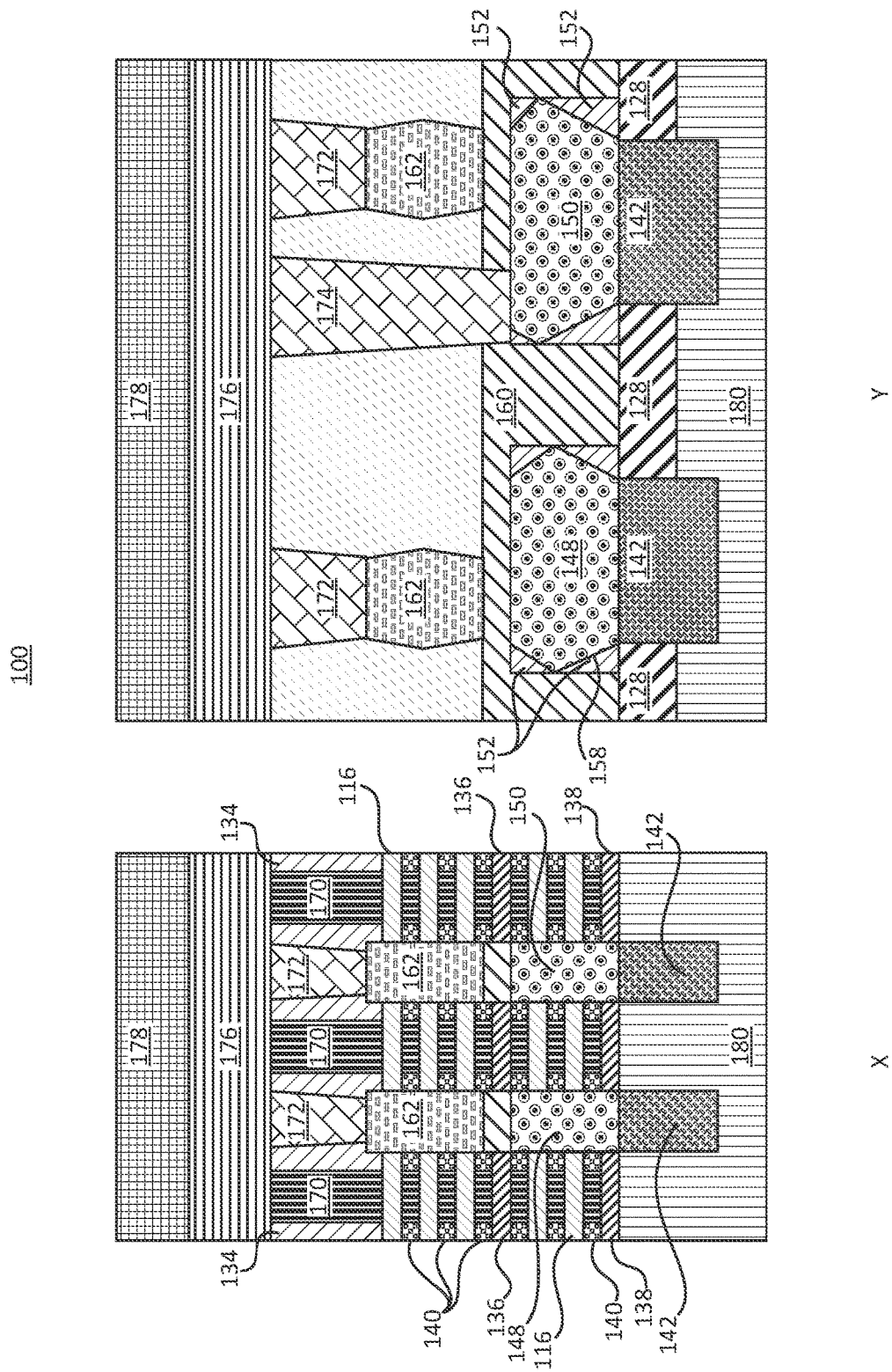
FIG. 13 shows cross-sectional views, taken at section lines X and Y, after a backside interlevel dielectric layer is formed, the backside interlevel dielectric layer includes a selectively etchable material relative to the STI region material, in accordance with an embodiment of the present invention.

Referring to FIG. 13, a dielectric layer 180 is formed over the STI 128, the sacrificial placeholders 142 and BDI 138. The dielectric layer 180 includes a material that is selectively removeable relative to the STI 128 and BDI 138. For example, if the STI 128 and BDI 138 include a silicon oxide, dielectric layer 180 can include a silicon nitride or silicon oxynitride to be selectively etchable with respect to STI 128 and BDI 138.

Figure 14:
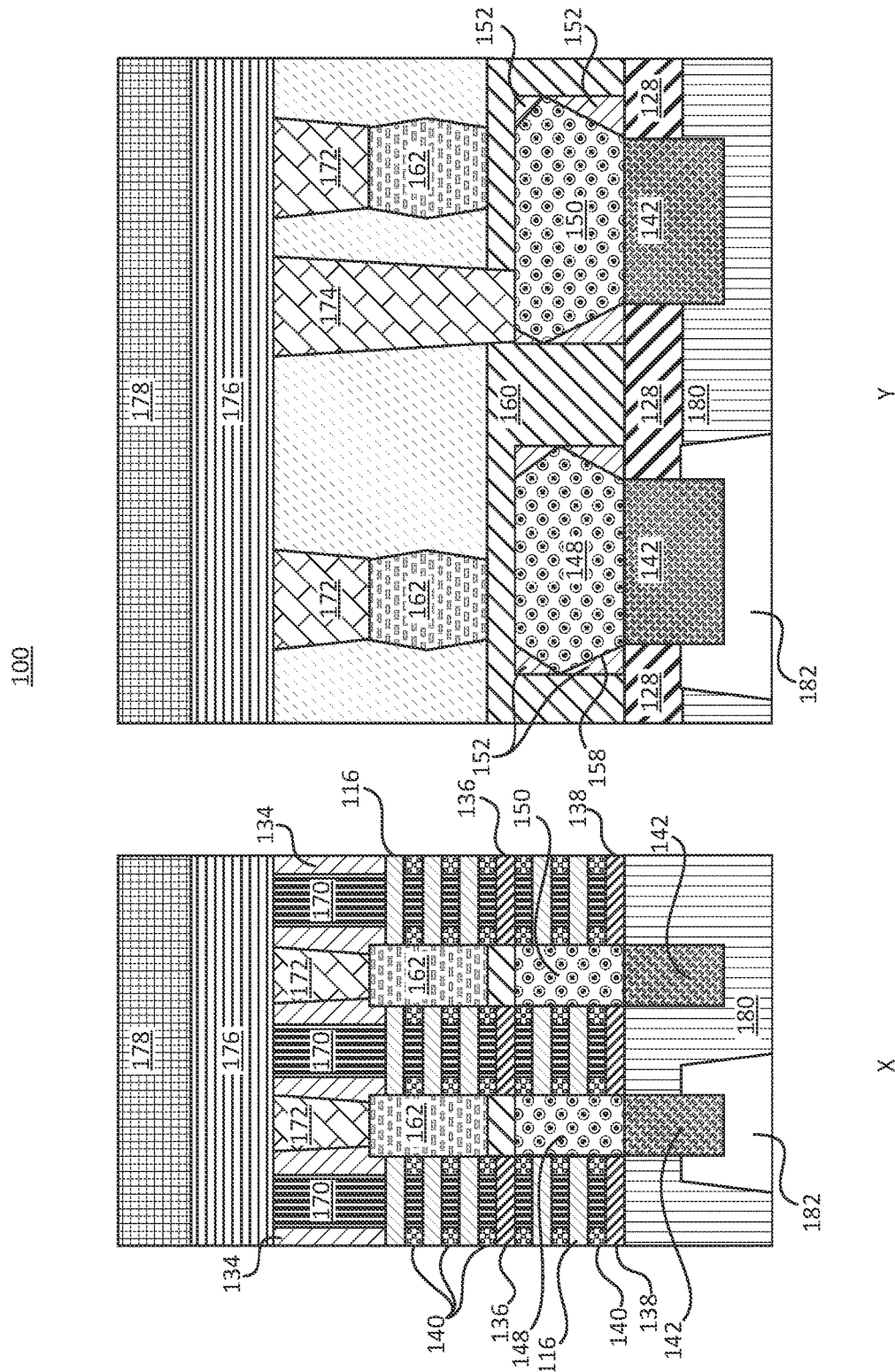
FIG. 14 shows cross-sectional views, taken at section lines X and Y, after the backside interlevel dielectric layer is etched to open contact holes or trenches to expose the sacrificial placeholders at selected contact positions, in accordance with an embodiment of the present invention.

Referring to FIG. 14, backside contacts are formed to make connections with the bottom active regions 148 and 150 from a bottom side of the device. Trenches or holes 182 are formed in the dielectric layer 180, which forms a backside ILD. Trenches or holes 182 can be patterned using photolithographic patterning techniques to create an etch mask to etch the trenches or holes 182 with an anisotropic etch., e.g., RIE. The trenches or holes 182 expose the underlying sacrificial placeholders 142 corresponding to, in this case, the bottom active region 148.

Figure 15:
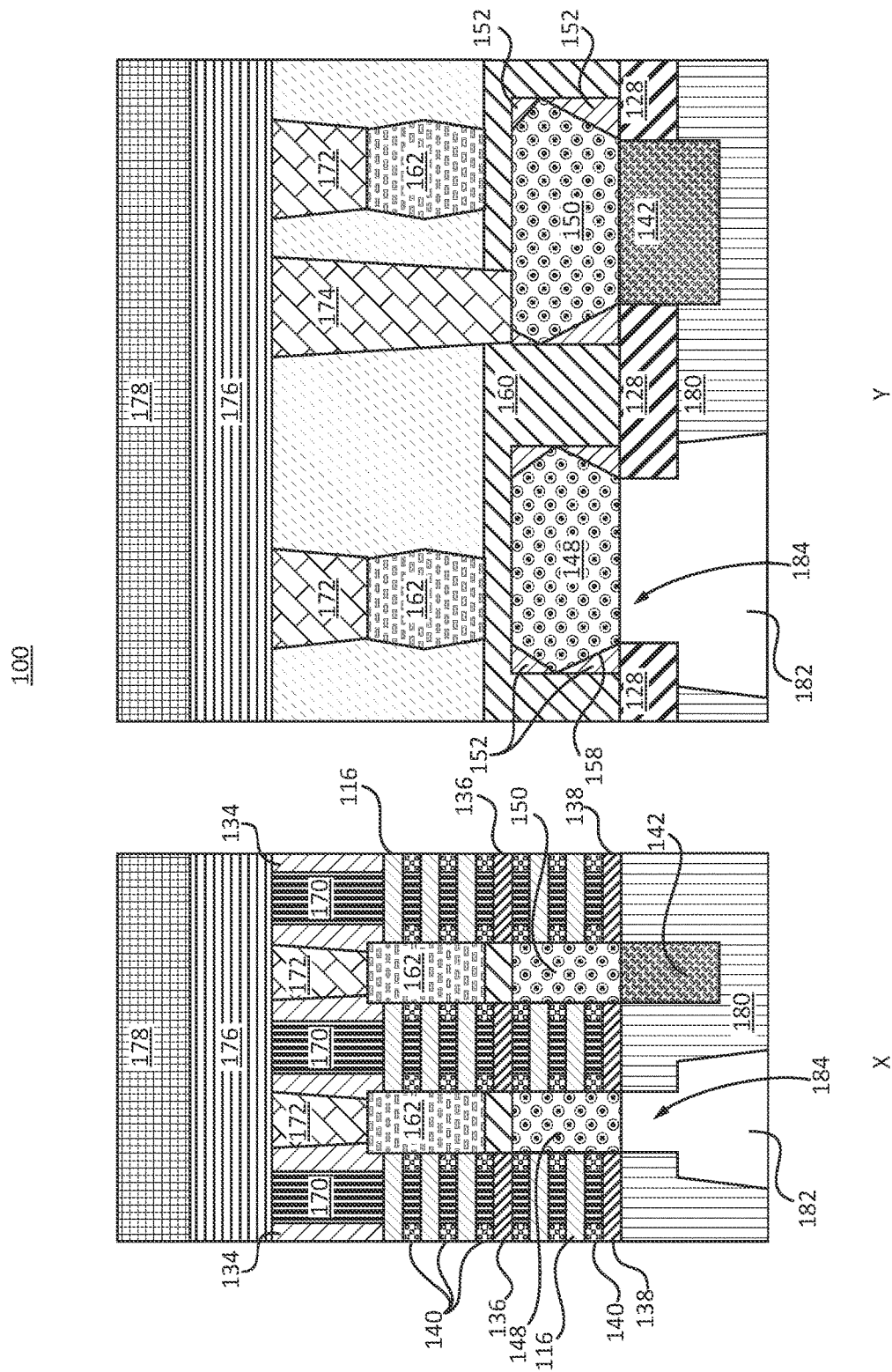
FIG. 15 shows cross-sectional views, taken at section lines X and Y, after the exposed sacrificial placeholders are removed to expose portions of the bottom active regions, in accordance with an embodiment of the present invention.

Referring to FIG. 15, the sacrificial placeholders 142 are removed in regions where the sacrificial placeholders 142 have been exposed by etching. The etch process can include a dry etch or wet etch that selectively removes the sacrificial placeholders 142 relative to the bottom active region 148, STI 128 and dielectric layer 180 to form openings 184. The corresponding bottom active region 148 is now exposed through opening 184.

Figure 16:
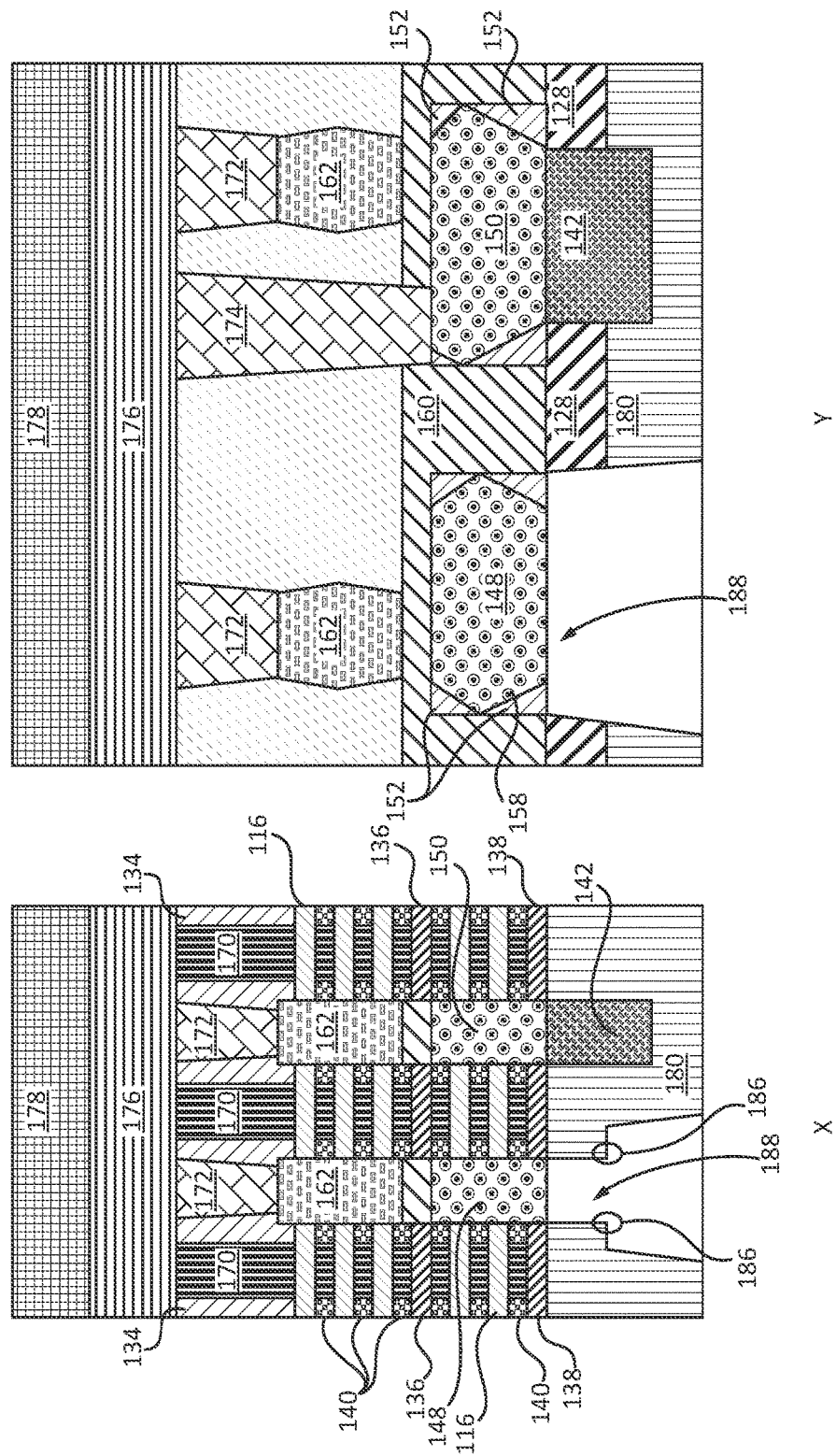
FIG. 16 shows cross-sectional views, taken at section lines X and Y, after exposed STI regions are etched back to expose the semiconductor material from overfilling that is in contact with the bottom active regions, in accordance with an embodiment of the present invention.

Referring to FIG. 16, STI 128 is further opened up to form opening 188 which exposes a larger portion of the bottom active region 148. Semiconductor fill 152 between faceted surfaces 158 of the bottom active region 148 and the dielectric layer 160 is also exposed. STI 128 is further opened up using a selective etch process that selectively etches the material of STI 128 relative to the dielectric layer 180. The selective etch can include a dry or wet etch. Since the STI 128 and the dielectric layer 180 are different materials, the selective etch provides expansion of the opening in the STI 128 without significantly reducing dielectric layer 180. In this way, corners 186 in opening 188 are maintained. These corners 186 ensure sufficient dielectric material between a later-formed contact and adjacent gates 170.

Figure 17:
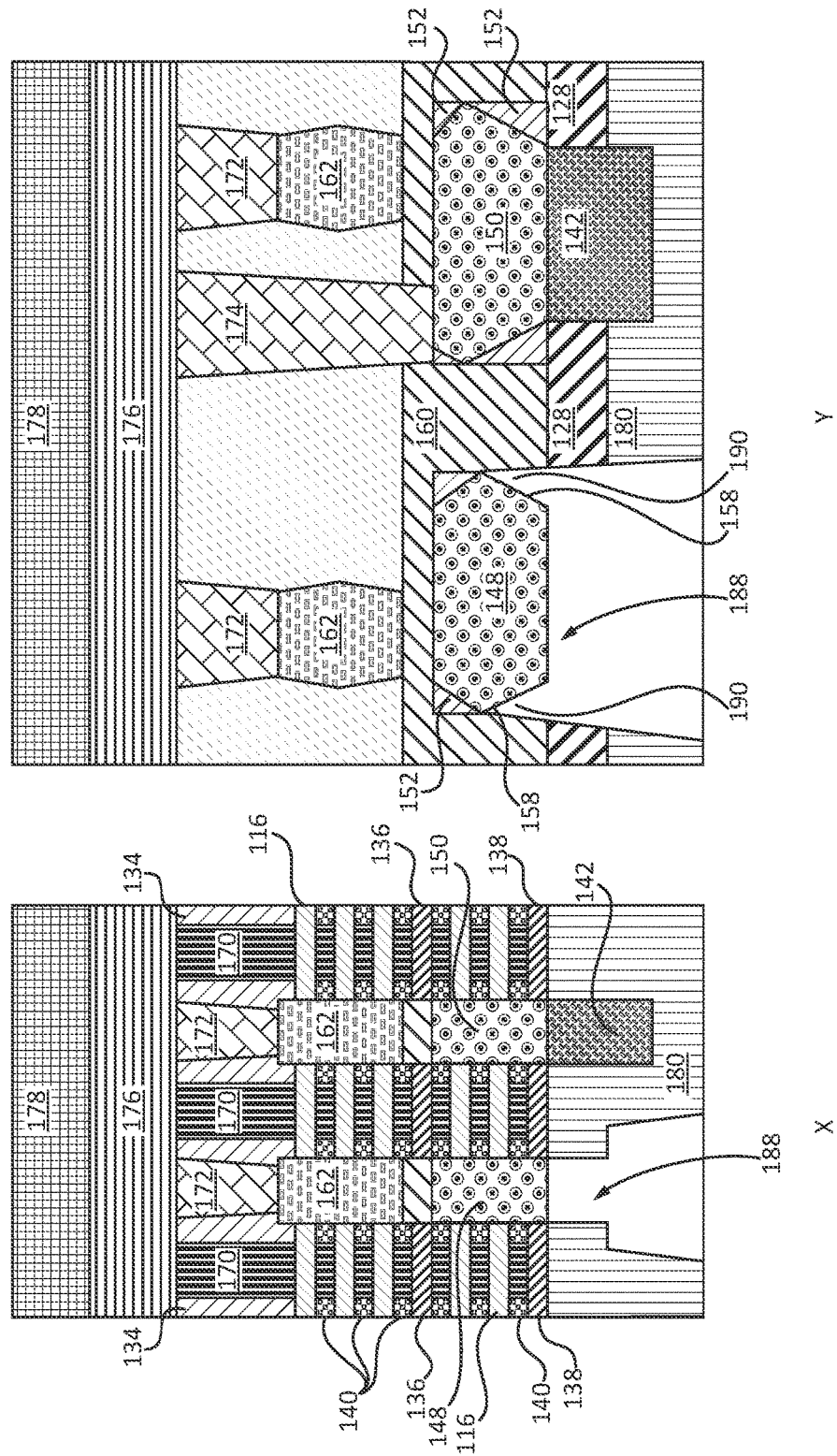
FIG. 17 shows cross-sectional views, taken at section lines X and Y, after the exposed semiconductor material from overfilling is removed to expose faceted surfaces of the bottom active regions, in accordance with an embodiment of the present invention.

Referring to FIG. 17, exposed portions of the semiconductor fill 152 adjacent to the bottom active region 148 are removed using a selective etch process that selectively etches the material of the semiconductor fill 152 with minimal damage to the STI 128, the bottom active region 148, the dielectric layer 180 and the dielectric layer 160. The selective etch can include a dry or wet etch. The selective etch exposes faceted surfaces 158 of an underside of the bottom active region 148. The bottom active region 148 is therefore exposed on an entire underside. This permits a greater contact area in region 190 when conductive material for the later-formed contact is provided.

It should be understood that while the FIGS. and description describe the bottom active region 148 being exposed and contacted by a backside contact, the bottom active region 150 can be exposed and contacted by a backside contact instead or in addition to the bottom active region 148.

Figure 18:
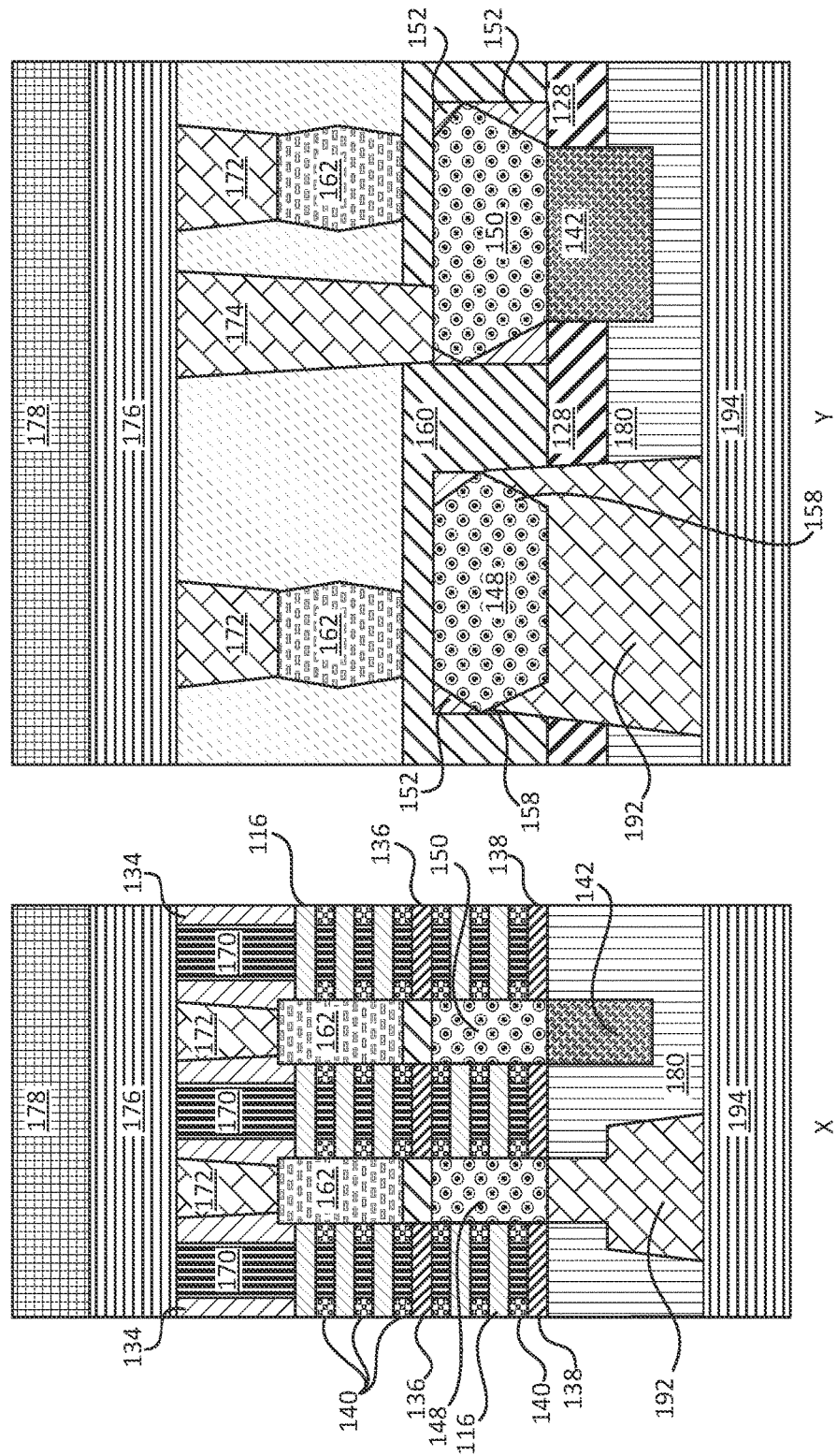
FIG. 18 shows cross-sectional views, taken at section lines X and Y, after forming wraparound contacts that contact at bottom faceted surfaces of the bottom active regions and backside back end of the line structures, in accordance with an embodiment of the present invention.

Referring to FIG. 18, in useful embodiments, a silicide liner, such as Ti, Ni, NiPt is deposited first, then a diffusion barrier can be formed in the opening 188 prior to a conductive fill. The diffusion barrier can include, e.g., TiN, TaN, or similar materials. A conductive fill is performed to fill the opening 188. The conductive fill can include materials, such as, e.g., Cu, Ru, Mo, Rh, W, Ir, and alloys or combinations of these and other conductive materials. In a particularly useful embodiment, the conductive fill includes Cu. The conductive fill can be formed using a deposition method, such as, e.g., CVD, PECVD, ALD or any other suitable deposition method. The conductive fill is planarized, e.g., by CMP, to form backside contacts 192.

Processing continues with the formation of a backside interconnect layer 194, which can include metal structures and dielectric layers to complete the bottom side of the stacked FET device and provide electrical access to the devices formed. The backside interconnect layer 194 is formed on the dielectric layer 180 and the backside contacts 192.

A stacked FET device 200 is provided having FETs formed in at least two layers 202 and 204. Layers 202 and 204 are separated by dielectric layer 160. Top FETs include top active regions 162 functioning as S/D regions activated by gate 170 in layer 202. Bottom FETs include bottom active regions 148 and 150 functioning as S/D regions activated by gate 170 in layer 204. The bottom FETs include a wraparound contact 192 to address contact resistance issues. The structure of the wraparound contact 192 increases surface area between the contact 192 and the bottom active region 148. In addition to a horizontal lower portion of the bottom active region 148, faceted surfaces 158 are contacted as well to ensure a reduction in contact resistance.

A semiconductor device such as stacked FET device 200 includes a stacked transistor structure having field effect transistors on at least two levels. The at least two levels include a top side and bottom side. Active regions 148 and 150 are formed on the bottom side including a leveled surface 154 (FIG. 6) facing the top side and a backside faceted surface 158 (FIG. 7) opposite the leveled surface. The leveled surface controls the height of the active regions 148 and 150, and an accurately controlled etch provides a same lateral dimension (within about 10%) of the active regions 148 and 150 despite lateral size variations during formation. The backside contact 192 is in contact with the backside faceted surfaces 158 to form the wraparound contact to reduce contact resistance.

Exemplary applications/uses to which the present invention can be applied include, but are not limited to semiconductor devices. Semiconductor devices can include processors, memory devices, application specific integrated circuits (ASICs), logic circuits or devices, combinations of these and any other circuit device. In such devices, one or more semiconductor devices can be included in a central processing unit, a graphics processing unit, and/or a separate processor- or computing element-based controller (e.g., logic gates, etc.). The semiconductor devices can include one or more on-board memories (e.g., caches, dedicated memory arrays, read only memory, etc.). In some embodiments, the semiconductor devices can include one or more memories that can be on or off board or that can be dedicated for use by a hardware processor subsystem (e.g., ROM, RAM, basic input/output system (BIOS), etc.).

In some embodiments, the semiconductor devices can include and execute one or more software elements. The one or more software elements can include an operating system and/or one or more applications and/or specific code to achieve a specified result. In still other embodiments, the semiconductor devices can include dedicated, specialized circuitry that perform one or more electronic processing functions to achieve a specified result. Such circuitry can include one or more field programmable gate arrays (FPGAs), and/or programmable applications programmable logic arrays (PLAs).

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," "top." "bottom" and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of devices and methods (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A semiconductor device, comprising:
   a stacked transistor structure having field effect transistors on at least two levels, the at least two levels including a top side and bottom side;
   a bottom active region disposed on the bottom side including a leveled surface facing the top side and a faceted backside surface opposite the leveled surface, the leveled surface including two different semiconductor materials; and
   a backside contact in contact with the faceted backside surface forming a wraparound contact to reduce contact resistance.

2. The semiconductor device as recited in claim 1, wherein the leveled surface is contacted by a contact from the top side.

3. The semiconductor device as recited in claim 1, wherein the contact from the top side contacts the two different semiconductor materials.

4. The semiconductor device as recited in claim 1, wherein the backside contact passes through a shallow trench isolation (STI) region.

5. The semiconductor device as recited in claim 4, wherein the backside contact is disposed within a backside interlevel dielectric layer and the STI region includes a material that has an etch selectivity that is different than that of the backside interlevel dielectric layer.

6. The semiconductor device as recited in claim 5, wherein the backside interlevel dielectric layer includes a contact trench for the backside contact, the contact trench including corners below adjacent gate structures to maintain dielectric below the adjacent gate structures.

7. The semiconductor device as recited in claim 1, wherein bottom active regions include a same lateral dimension despite lateral size variations during formation.

8. The semiconductor device as recited in claim 1, wherein the leveled surface includes facets and the facets are filled with an amorphous semiconductor material.

9. The semiconductor device as recited in claim 1, wherein bottom active regions without the backside contact include a sacrificial placeholder connected to the faceted backside surface.

10. A method for fabrication of a semiconductor device, comprising:
    forming bottom active regions with a first semiconductor material through a shallow trench isolation region on a substrate, the bottom active regions including a faceted surfaces;
    filling regions between the bottom active regions with a second semiconductor material;
    recessing the second semiconductor material and the first semiconductor material to provide a level surface across the bottom active regions;
    laterally cutting the bottom active regions to provide a substantially uniform lateral dimension for each of the bottom active regions;
    forming a bottom interlevel dielectric layer (ILD);
    fabricating top structures including top active regions, gate structures and top metallization structures;
    removing the substrate from a bottom side;
    exposing the second semiconductor material on the bottom side of at least one of the bottom active regions;
    selectively removing the second semiconductor material to expose the faceted surfaces of the at least one of the bottom active regions; and
    forming a backside wraparound contact in contact with exposed surfaces including the faceted surfaces of the at least one of the bottom active regions.

11. The method as recited in claim 10, wherein forming the bottom active regions with a first semiconductor material through a shallow trench isolation (STI) region on a substrate includes:
    forming a sacrificial placeholder through the STI region; and
    epitaxially growing the bottom active regions on the sacrificial placeholder.

12. The method as recited in claim 11, wherein exposing the second semiconductor material on the bottom side of at least one of the bottom active regions includes:
  forming a backside interlevel dielectric layer of a material that is selectively etchable relative to material of the STI region; and
  opening up contact holes through the backside interlevel dielectric layer.

13. The method as recited in claim 11, wherein filling regions between the bottom active regions with the second semiconductor material includes:
  selecting the second semiconductor material in accordance with a conductivity type of the bottom active regions of the sacrificial placeholder.

14. The method as recited in claim 10, wherein recessing the second semiconductor material and the first semiconductor material to provide the level surface across the bottom active regions includes evenly etching back the second semiconductor material and the first semiconductor material to provide a substantially uniform height for the bottom active regions.

15. The method as recited in claim 10, wherein laterally cutting the bottom active regions to provide the substantially uniform lateral dimension for each of the bottom active regions includes:
  forming an organic planarizing layer (OPL) over the level surface; and
  etching through the OPL and portions of the bottom active regions to control the substantially uniform lateral dimension.

16. The method as recited in claim 15, wherein etching through the OPL and portions of the bottom active regions includes etching through portions of the second semiconductor material in contact with facets on a top side of the bottom active regions.

17. A method for fabrication of a semiconductor device, comprising:
  forming sacrificial placeholders through a shallow trench isolation (STI) region formed on a substrate;
  epitaxially growing bottom active regions with a first semiconductor material from the sacrificial placeholders, the bottom active regions including top faceted surfaces and bottom faceted surfaces;
  filling regions between the bottom active regions with a second semiconductor material;
  recessing the second semiconductor material and the first semiconductor material to provide a level surface across the bottom active regions;
  forming an organic planarizing layer (OPL) over the level surface;
  etching through the OPL and portions of the bottom active regions to cut a substantially uniform lateral dimension into the bottom active regions;
  forming a bottom interlevel dielectric layer (ILD);
  fabricating top structures including top active regions, gate structures and top metallization structures;
  applying a carrier wafer over the top structures;
  flipping the semiconductor device;
  removing the substrate from a bottom side;
  exposing the second semiconductor material on the bottom side of at least one of the bottom active regions including removing exposed sacrificial placeholders and opening up the STI region;
  selectively removing the second semiconductor material to expose the bottom faceted surfaces of the at least one of the bottom active regions; and
  forming a backside wraparound contact in contact with exposed surfaces including the bottom faceted surfaces of the at least one of the bottom active regions.

18. The method as recited in claim 17, wherein filling regions between the bottom active regions with the second semiconductor material includes:
  selecting the second semiconductor material in accordance with a conductivity type of the bottom active regions.

19. The method as recited in claim 17, wherein recessing the second semiconductor material and the first semiconductor material to provide the level surface across the bottom active regions includes evenly etching back the second semiconductor material and the first semiconductor material to provide a substantially uniform height for the bottom active regions.

20. The method as recited in claim 17, wherein exposing the second semiconductor material on the bottom side of at least one of the bottom active regions includes:
  forming a backside interlevel dielectric layer of a material that is selectively etchable relative to material of the STI region; and
  opening up contact holes through the backside interlevel dielectric layer.

* * * * *